(12) United States Patent
Iketani et al.

(10) Patent No.: US 6,229,365 B1
(45) Date of Patent: *May 8, 2001

(54) SEMICONDUCTOR INTEGRATED CIRCUIT DEVICE OPERATING STABLY AT A PLURALITY OF POWER SUPPLY VOLTAGE LEVELS

(75) Inventors: Masayuki Iketani; Shigeki Ohbayashi, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/982,033

(22) Filed: Dec. 1, 1997

(30) Foreign Application Priority Data

May 26, 1997 (JP) ................................................. 9-135127

(51) Int. Cl.[7] ...................................................... H03K 5/12
(52) U.S. Cl. ............................ 327/170; 327/437; 326/81
(58) Field of Search .................................... 327/205, 206, 327/170, 437, 525; 326/87, 91

(56) References Cited

U.S. PATENT DOCUMENTS

| | | | |
|---|---|---|---|
| 4,563,594 | * 1/1986 | Koyama | 327/206 |
| 4,593,203 | * 6/1986 | Iwahashi et al. | 327/525 |
| 4,608,530 | * 8/1986 | Bacrania | 323/315 |
| 4,733,105 | * 3/1988 | Shin et al. | 327/333 |
| 5,175,445 | * 12/1992 | Kinugasa et al. | 326/87 |
| 5,389,834 | * 2/1995 | Kinugasa et al. | 326/21 |
| 5,428,311 | * 6/1995 | McClure | 327/276 |
| 5,554,942 | * 9/1996 | Herr et al. | 326/33 |
| 5,559,461 | * 9/1996 | Yamashina et al. | 327/205 |
| 5,686,853 | * 11/1997 | Iima et al. | 327/374 |
| 5,838,177 | * 11/1998 | Keeth | 327/108 |
| 5,838,189 | * 11/1998 | Jeon | 327/537 |
| 5,841,299 | * 11/1998 | De | 326/98 |
| 5,886,556 | * 3/1999 | Ganger et al. | 327/206 |

* cited by examiner

Primary Examiner—Terry D. Cunningham
(74) Attorney, Agent, or Firm—McDermott, Will & Emery

(57) ABSTRACT

At the last stage of a level converter that provides an internal signal to an internal signal output node, MOS transistors that are rendered conductive alternatively are provided as current source transistors. These additional MOS transistors are selectively rendered conductive according to the voltage level of, for example, a bonding pad. The charging/discharging current towards the internal node can be adjusted. Accordingly, the rising time and falling time of the internal signal can be constantly made equal. Thus an input/output circuit that can provide a signal at a proper timing even when the operating environment such as the system power supply voltage changes can be implemented.

11 Claims, 13 Drawing Sheets

LARGE LOAD

SMALL LOAD

DEFECTIVE MARGIN

ERRONEOUS OPERATION

SEMICONDUCTOR INTEGRATED CIRCUIT DEVICE OPERATING STABLY AT A PLURALITY OF POWER SUPPLY VOLTAGE LEVELS

BACKGROUND OF THE INVENTION

1. Field of the Invention

The present invention relates to semiconductor integrated circuit devices, and particularly to a structure of a signal input/output unit providing an interface between this semiconductor integrated circuit device and an external device. More particularly, the present invention relates to a structure of a signal (including data signal) input/output unit of a synchronous semiconductor memory device that operates in synchronization with a clock signal.

2. Description of the Background Art

FIG. 15 schematically shows an entire structure of a conventional synchronous semiconductor memory device. Referring to FIG. 15, a synchronous semiconductor memory device 1 includes an input circuit 2 operating with a power supply voltage Vddi applied to a power supply node 1a or a power supply voltage Vdd from a power supply node 1d and a ground voltage Vss as both operating power supply voltages for taking in an externally applied input signal IN at an input node 1c in synchronization with a clock signal CLK applied from a clock input node 1b, to generate an internal signal of a power supply voltage Vdd level, a memory internal circuit 3 operating with a power supply voltage Vdd applied to power supply node 1d and ground voltage Vss applied to a ground node 1e as both operating power supply voltages for carrying out a memory cell select operation and data writing/reading operation according to a signal applied from input signal 2 in synchronization with clock signal CLK, and an output circuit 4 operating with a power supply voltage VddQ applied to a power supply node 1f and a ground voltage VssQ applied to a ground node 11 as both operating power supply voltages for providing memory cell data read out from memory internal circuit 3 to a data output node 1h.

Power supply voltage Vddi is at a level according to the power supply voltage level of the system in which synchronous semiconductor memory device 1 is employed. For example, power supply voltage Vddi takes the level of 2.5V or 1.8V. Power supply voltage Vdd is the power supply voltage used for the internal operation of synchronous semiconductor memory device 1. Power supply voltage Vdd is higher than power supply voltage Vddi, and is, for example, 3.3V. By using power supply voltage Vddi as one operating power supply voltage in input circuit 2, the input logic level of the memory device is adapted to the interface of a separate logic or processor and to the power supply voltage level of the system in which this synchronous semiconductor memory device is employed.

Input signal IN applied to input circuit 2 includes an address signal, a control signal, and write data. Memory internal circuit 3 includes a memory cell array with a plurality of memory cells, and a data write circuit and data read out circuit performing data writing and reading in synchronization with a clock signal.

Power supply voltage VddQ and ground voltage VssQ dedicated for output are applied to output circuit 4. Output node 1h has a width of a plurality of bits such as 16 bits to allow many output buffers in output circuit 4 to operate simultaneously due to the dedicated voltages VddQ and VssQ. Output circuit 4 has to drive a large output load. This large output load must be driven at a high speed. By applying power supply voltage VddQ and ground voltage VssQ exclusively for data output, output circuit 4 can be operated stably. Also, the adverse effect of the power supply noise during operation of output circuit 4 on the operation of other circuits can be prevented.

Input circuit 2 receives a voltage Vddi according to the system power supply voltage as one operating power supply voltage to the first stage thereof connected to input node 1c, and takes in a signal according to this external interface to alter the voltage level for generating an internal signal of a power supply voltage Vdd level.

Ground voltage Vss to input circuit 2 may be applied via a node dedicated to the input circuit or via ground node 1e.

FIG. 16 shows an example of a structure of the first stage of input circuit 2 of FIG. 15. Referring to FIG. 16, the first stage of the input circuit includes a buffer circuit 2a operating with power supply voltage Vddi as one operating power supply voltage, and rendered operative when a first input stage cut signal ZNC generated from internal circuitry not shown is inactive (H level:logical high) for buffering an externally applied input signal IN for transmission to a node A, an inverter circuit 2b operating with power supply voltage Vddi as one operating power supply voltage for inverting the signal transmitted to node A from buffer circuit 2a, a level converter 2c for converting the amplitude of a signal applied to a node B from inverter circuit 2b to a level of power supply voltage Vdd, and an inverter buffer 2d operating with power supply voltage Vdd as one operating power supply voltage for buffering a level converted signal output from level converter 2c to generate an internal signal INT onto a node E.

First input stage cut signal ZNC applied to buffer circuit 2a is generated according to, for example, a chip select signal and a clock signal CLK. When first input state cut signal ZNC attains an active state of an L level (logical low), the synchronous semiconductor memory device attains a stand-by state. Therefore, no access is effected.

Buffer circuit 2a includes a p channel MOS transistor 2aa connected between a power supply voltage Vddi supply node Vddi (the node and the power supply voltage applied thereto are indicated by the same reference character hereinafter) and node A, and receiving first input stage cut signal ZNC at its gate, a p channel MOS transistor 2ab connected between power supply node Vddi and node A, and receiving an input signal IN1 at its gate, and n channel MOS transistors 2ac and 2ad connected in series between node A and a ground voltage Vss supply node (referred to as ground node Vss hereinafter). First input stage cut signal ZNC is applied to the gate of MOS transistor 2ac. Input signal IN1 is applied to the gate of MOS transistor 2ad.

Inverter circuit 2b includes a p channel MOS transistor 2ba connected between power supply node Vddi and node B, and having a gate connected to node A, and an n channel MOS transistor 2bb connected between node B and the ground node, and having a gate connected to node A. Inverter circuit 2b has a structure of a CMOS inverter.

Level converter 2c includes a p channel MOS transistor 2cc connected between power supply node Vdd to which power supply voltage Vdd is supplied and a node C, and having a gate connected to a node D, a p channel MOS transistor 2cd connected between power supply node Vdd and node D, and having a gate connected to node C, an n channel MOS transistor 2ca connected between node C and the ground node, and having a gate connected to node B, and an n channel MOS transistor 2cd connected between node D and the ground node, and having a gate connected to node A. This level converter 2c has a structure of a shift latch type level converter.

Inverter buffer 2d includes a p channel MOS transistor 2da connected between power supply node Vdd and a node E, and having a gate connected to node C, and an n channel MOS transistor 2db connected between node E and the ground node, and having a gate connected to node C. Internal signal INT on node E is incorporated into the input circuit shown in FIG. 15 in synchronization with clock signal CLK. Internal signal INT is also used for the internal operation.

The operation of the first stage of the input circuit of FIG. 16 will be described hereinafter with reference to the operation waveform shown in FIG. 17.

Before time t0, first input stage cut signal ZNC is at an active state of an L level. In buffer circuit 2a, MOS transistors 2aa and 2ac is in a conductive state and a non-conductive state, respectively. Therefore, node A is charged to the level of power supply voltage Vddi by MOS transistor 2aa irrespective of the voltage level of input signal IN1. Inverter circuit 2b inverts the signal of node A. Also, level converter 2c inverts the logic level of node B to transmit the inverted signal to node C (level conversion is carried out). Inverter buffer 2d inverts the logic level of node C for transmission to node E to generate internal signal INT. Thus, prior to time t0, nodes A, B, C and E have voltage levels of an H level, an L level, an H level, and an L level, respectively.

At time t0, first input stage cut signal ZNC rises to an H level of an inactive state. In response, MOS transistors 2aa and 2ac are rendered nonconductive and conductive, respectively, whereby buffer 2a which is the first stage of the input circuit operates as a CMOS inverter. At time t1, input signal IN1 is driven to an H level, whereby node A is discharged to the level of ground voltage Vss via MOS transistors 2ac and 2ad. In response to a low voltage level of node A, MOS transistor 2ba in inverter circuit 2b is rendered conductive, whereby the voltage of node B is driven from an L level to an H level (the level of power supply voltage Vddi).

In level converter 2c, MOS transistor 2ca is rendered conductive according to a raised voltage of node B, whereby node C is discharged to the level of the ground voltage. In response, MOS transistor 2cd conducts to increase the voltage level of node D. In response, MOS transistor 2cc makes a transition to a non-conductive state. MOS transistor 2cb attains a non-conductive state since the voltage of node A attains an L level. MOS transistor 2ca reduces the voltage of node C to the level of the ground potential. In response, the conductance of MOS transistor 2cd is increased to charge node D at a higher speed. Eventually, node C attains the level of the ground voltage, and node D attains the level of power supply voltage Vdd.

In response to this voltage reduction at node C, the voltage level of internal signal INT applied to node E from inverter buffer 2d is driven to an H level (the level of power supply voltage Vdd) from an L level.

At time t2, input signal IN1 is pulled down from an H level to an L level. In buffer circuit 2a of the first stage of the input circuit, MOS transistors 2ab and 2ad are rendered conductive and non-conductive, respectively, whereby the voltage of node A rises to the level of power supply voltage Vddi. When the voltage level of node A becomes higher than the input logic threshold value of inverter circuit 2b, the voltage of node B begins to drop and to be discharged to the level of the ground potential. In response, MOS transistors 2ca and 2cb are driven to a non-conductive state and a conductive state, respectively, in level converter 2c. As a result, the voltage of node D is reduced. MOS transistor 2cc conducts to charge node C. Accordingly, the voltage of node C rises to the level of power supply voltage Vdd, and the voltage of node D falls to the level of the ground voltage. The voltage level of node C is inverted by inverter buffer 2d, whereby internal signal INT on node E is lowered to the ground voltage level.

At time t3 when input signal IN1 is driven again to an H level from an L level, an operation similar to that at time t1 occurs. The voltage of node A is pulled down from an H level to an L level, and the voltage of node B is pulled up to an H level from an L level. In response, the voltage of node C is pulled down from an H level to an L level. Then, the voltage of node E is pulled up from an L level to an H level.

As shown in FIG. 16, a power supply voltage Vddi of a level identical to that of the power supply voltage of the system is applied as one operating power supply voltage to the first stage of the input circuit connected to the input node and serving as an interface. The logic amplitude of externally applied input signal IN1 can be identified correctly to generate an internal signal according to the logic level of this input signal IN1. In order to operate the internal circuit at high speed, the voltage level is converted to power supply voltage Vdd higher in level than power supply voltage Vddi by level converter 2c. Then, the output signal of level converter 2c is amplified by inverter buffer 2d to generate internal signal INT speedily with a relatively greater driving capability.

By the series of operations, an internal signal INT of a logic level according to input signal IN1 can be generated precisely and speedily to carry out an internal operation even when the logic amplitude of input signal IN1 differs from the logic amplitude of internal signal INT. Internal signal INT is incorporated in synchronization with clock signal CLK to be subject to a required process.

FIG. 18 shows an example of a structure of the last stage of output circuit 4 shown in FIG. 15. Referring to FIG. 18, output circuit 4 includes an inverter 4a receiving an internal read data /RD, an NOR circuit 4b receiving an internal read data /RD and an output enable signal /OE, a NOR circuit 4c receiving an output signal of inverter 4a and output enable signal /OE, an inverter circuit 4d receiving an output signal of NOR circuit 4b, an n channel MOS transistor 4e connected between a node supplying power supply voltage VddQ (referred to as power supply node VddQ hereinafter) and an output node J, and receiving an output signal of NOR circuit 4b at a gate thereof, an n channel MOS transistor 4f connected between output node J and the node that supplies ground voltage VssQ (referred to as ground node VssQ hereinafter), and receiving an output signal of NOR circuit 4c at a gate thereof, and a p channel MOS transistor 4g connected between power supply node VddQ and output node J, and receiving an output signal of inverter 4d at a gate thereof. The one operating power supply voltage of inverter circuits 4a and 4d and NOR circuits 4b and 4c may be internal power supply voltage Vdd or may be power supply voltage VddQ. The operation of the output circuit shown in FIG. 18 will now be described with reference to the signal waveform diagram of FIG. 19.

Before time t0, output enable signal /OE is at an inactive state of an H level. The voltages of output nodes G and NH of NOR circuits 4b and 4c is at an L level. Therefore, MOS transistors 4e and 4f are both kept non-conductive. Also, the output signal of inverter 4d is at an H level, and p channel MOS transistor 4g is in a non-conductive state. Therefore, output circuit 4 is in an output high impedance state.

At time t0, output enable signal /OE attains an active state of an L level, whereby output circuit 4 is rendered operative. In this state, NOR circuits 4b and 4c operate as inverters. When internal read data /RD read out from a memory cell attains an H level, NOR circuit 4b provides an output signal of an L level and NOR circuit 4c provides an output signal of an H level. Therefore, MOS transistors 4e and 4g are rendered non-conductive, whereas MOS transistor 4f is rendered conductive. Node A is discharged to the level of ground voltage VssQ.

When internal read data /RD is pulled down to an L level from an H level at time t1, the output signal of NOR circuit 4b is driven to an H level. MOS transistors 4e and 4g are rendered conductive. NOR circuit 4c provides an output signal of an L level, and an MOS transistor 4f is rendered non-conductive. Therefore, output node J is driven to the voltage level of power supply voltage VddQ by MOS transistors 4e and 4g.

At time t2, when internal read data /RD is pulled up to an H level from an L level, the voltage of output node E of NOR circuit 4b is pulled down to an L level from an H level. MOS transistors 4e and 4g are rendered non-conductive. The voltage of output node NH of NOR circuit 4c attains an H level, whereby MOS transistor 4f conducts. Output node J is discharged to the level of ground voltage VssQ.

The reason why n channel MOS transistor 4e and p channel MOS transistor 4g are employed to raise the voltage level of output node J to power supply voltage VddQ is described in the following. When the voltage level of node G rises only of the level of power supply voltage VddQ, n channel MOs transistor 4e cannot drive output node J to the voltage level of power supply voltage VddQ (threshold voltage loss). This loss of the threshold voltage of MOS transistor 4e is replenished by p channel MOS transistor 4g driving output node J to the level of power supply voltage VddQ. As a result, the voltage at output node J exhibits a full swing between power supply voltage VddQ and ground voltage VssQ.

A semiconductor memory device is employed in various systems. As a system power supply voltage thereof, various voltage levels such as 2.5V, 1.86V, or a lower voltage are used. If interface circuits (input/output circuits) optimized corresponding to the interfaces of various voltage levels are to be produced, the number of types of synchronous semiconductor memory devices increases. The product management will become tedious. In addition, when the system power supply voltage is altered, there will be no compatibility in the synchronous semiconductor memory devices. This is not economic for the user. If power supply voltages of a plurality of interface levels can be accommodated with one chip, the product management can be simplified, and it also becomes more convenient for a user to use the memory devices. However, problems as set forth in the following arise when the power supply voltage is converted with a structure of the first stage of input circuit using MOS transistors as shown in FIG. 16. The current driving capability of a MOS transistor varies according to the gate voltage thereof. The current driving capability becomes greater as the gate voltage becomes higher (square characteristics in saturated region).

Referring to FIG. 20, a case is considered where a circuit is implemented satisfying required conditions with a power supply voltage Vddi of 2.5V, for example. When input signal IN1 is driven to an L level from an H level, node A is charged to the level of power supply voltage Vddi by MOS transistor 2ab. In response to this voltage rise of node A, the potential of node B is reduced. The voltage amplitude of nodes A and B corresponds to the power supply voltage Vddi level. When the voltage of node A is raised, the conductance of MOS transistor 2cb is increased, whereby the voltage of node D is reduced to the ground voltage level. Then, node C is charged to the level of power supply voltage Vdd via MOS transistor 2cc.

When MOS transistor 2cc conducts, the voltage of node D is discharged to the level of the ground voltage. Therefore, MOS transistor 2cc charges node C to the level of power supply voltage Vdd without an effect of power supply voltage Vddi. MOS transistor 2ca drives node B to the ground voltage level when rendered non-conductive. The voltage level of node C is inverted by inverter buffer 2d, whereby the voltage of internal signal INT of node E is pulled down from an H level to an L level. Taking into account the delay time of each gate, the delay time of the transition of input signal IN1 to internal signal INT is assumed to be td.

When input signal IN1 is driven to an H level from an L level, node A is discharged by MOS transistors 2ac and 2ad to the level of the ground voltage. In response, the voltage of node B reaches the level of power supply voltage Vddi. The conductance of MOS transistor 2ca is increased, and the voltage of node C is reduced. In response to the reduction of the voltage at node C, MOS transistor 2cd is driven to a conductive state and MOS transistor 2cc to a non-conductive state. In response, the voltage of node C is driven to an L level, and internal signal INT is pulled up to the level of power supply voltage Vdd. In this case, the discharge rate of node C by MOS transistor 2ca is equal to the discharge rate of node D by MOS transistor 2cb. Accordingly, the charging/discharging rate of node C is considered to be equal. Therefore, the delay time of internal signal INT when input signal IN1 is driven to an H level from an L level is also td.

Consider the case where power supply voltage Vddi is set lower than 2.5V, i.e. set to 1.8V, for example. In buffer circuit 2a and inverter circuit 2b, the charge/discharge rate of nodes A and B is identical. However, the signal potential transition is slower than that in the case where power supply voltage Vddi is 2.5V since the current driving capability of the MOS transistor is smaller, as shown by the broken line in FIG. 20. Therefore, the delay time is increased.

When the voltage of node B attains the ground voltage level, MOS transistor 2ca attains a non-conductive state and MOS transistor 2cb attains a conductive state. In this case, the decrease in potential of node D is slightly more gentle than that in the case of 2.5V. However, node D is eventually discharged to the level of the ground voltage, so that MOS transistor 2cc drives node C to the level of power supply voltage Vdd at a charging rate faster than the discharging rate of MOS transistor 2ca. Therefore, the period of falling time of the voltage of node C becomes longer than period of rising time as shown by the broken line in FIG. 20. Accordingly, the rising time of internal signal INT of node E becomes longer to cause a slower rising rate.

When this power supply voltage Vddi attains a lower level such as 1.8V, the delay time of internal signal INT with respect to input signal IN1 includes a delay time td1 at the falling edge and td2 at the rising edge as shown in FIG. 20. The delay time of internal signal INT differs in the rising thereof and in the falling thereof from each other.

When internal signal INT has an amplitude of power supply voltage Vdd with a lower power supply voltage Vddi as shown in FIG. 21, the period of time required for internal signal INT to be driven to an L level from an H level differs from the period of time required for internal signal INT to be driven to an H level from an L level. More specifically, the time required for internal signal INT to be definite at H level differs from the time for internal signal INT to be definite at L level. Since the internal operation timing is determined by this worst case, the operating speed is determined by the rising time of internal signal INT. As a result, a high speed operation cannot be carried out. Particularly in the case where the rising and falling time of internal signal INT differs from each other, problems set forth in the following occur in a synchronous semiconductor memory device.

Referring to FIG. 22A, a synchronous semiconductor memory device has a set up time ts and a hold time th of signal INT determined with respect to a rise, for example, of clock signal CLK. When internal signal INT is set to L level for an active state thereof, the hold time th of internal signal INT becomes unnecessarily longer. Thus, transition to a subsequent operation cannot be effected speedily.

Referring to FIG. 22B, when internal signal INT is set to an H level to be activated at the rising edge of clock signal CLK, the set up time ts is shifted in the direction of the rise point of clock signal CLK. Therefore, the set up time ts becomes shorter to prevent proper incorporation of a signal.

In a general synchronous semiconductor memory device, the specification requires that the set up time ts is 1.5 ns and the hold time th is 0.5 ns when the clock signal CLK is 100 MHz. An intended operation cannot be reliably carried out unless internal signal INT is properly maintained at the level of a predetermined voltage during the set up time and the hold time. A proper operation cannot be guaranteed when the rising time and falling time of the signal varies to be different from the specification values of the set up time and hold time. When the timing offset is, for example, 0.2 ns, such offset value is greater than at least 10% of the permissible time of the set up time and hold time, and therefore when the specification value of the set up/hold time is determined taking into account such a large timing offset, high speed access cannot be realized.

In contrast, when the discharging rate and the charging rate of node C in level converter 3 is set to be equal with a power supply voltage Vddi of 1.8V, the discharging rate of node C becomes higher when power supply voltage Vdd takes a higher value of 2.5V. The rising time of internal signal INT becomes shorter to result in an opposite problem.

When power supply voltage VddQ in output circuit 4 of FIG. 18 is set to a voltage level identical to power supply Vddi in order to cooperate with an external interface, the charging rate of p channel MOS transistor 4g is reduced as the power supply voltage VddQ is lowered, and becomes slower than the discharging rate of the node J. If the charging and discharging rates of node A are set to be equal for a lower level of power supply voltage VddQ, the current driving capability of p channel MOS transistor 4g will become greater to result in a faster charging rate when power supply voltage VddQ becomes higher. In this case, ringing will occur at output node J by the greater current driving capability as shown in FIG. 23B. Some time is required until that ringing is dissipated. Therefore, data cannot be output speedily. In other words, the output data ascertion timing is delayed until the ringing is eliminated.

Further even if the voltage level of power supply voltage VddQ is constant, the load connected to output node J differs depending on the system in which the synchronous semiconductor memory device is used. When a synchronous semiconductor memory device is incorporated into a system by being arranged on a circuit board, the load capacitance of the wiring on the board differs for different systems, and the load of output node J will differ from system to system. If the load is small, the output node will be charged/discharged at high speed. This means that ringing will easily occur at output node J. Therefore, data cannot be output stably. Ringing occurs since a great load, particularly an inductance component, is present at, for example, the pad, the pin terminal, and the wires on the board. When a large load is present, output node J cannot be charged/discharged speedily, data cannot be set at an ascertained state at the rise of a clock signal as shown in FIG. 23, and erroneous operation will occur.

The above-described problems in an input/output circuit is encountered also in a general semiconductor integrated circuit device, not limited to a synchronous semiconductor memory device.

SUMMARY OF THE INVENTION

An object of the present invention is to provide a semiconductor integrated circuit device that has an interface that operates correctly even in a different operating environment.

Another object of the present invention is to provide a semiconductor integrated circuit device that operates stably without deviation in the timing of an internal signal even for a plurality of power supply voltages.

A further object of the present invention is to provide a semiconductor integrated circuit device including an input circuit that generates no deviation in timing of an internal signal even at different levels of an operating power supply voltage.

Still another object of the present invention is to provide a semiconductor integrated circuit device including an output circuit that operates stably without generating noise even in a different operating environment.

A semiconductor integrated circuit device according to the present invention includes a signal process circuit for performing a predetermined process on an applied signal to output a signal corresponding to the applied signal on a node, and an adjust circuit coupled to the signal process circuit for adjusting the potential transition speed of a signal on the node in a programmable manner.

By adjusting the potential transition speed of a signal at the output node of the signal process circuit in a programmable manner, the signal transition speed can be adjusted according to the operating environment in which the semiconductor integrated circuit device is applied. An optimum operating condition corresponding to the operating environment can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
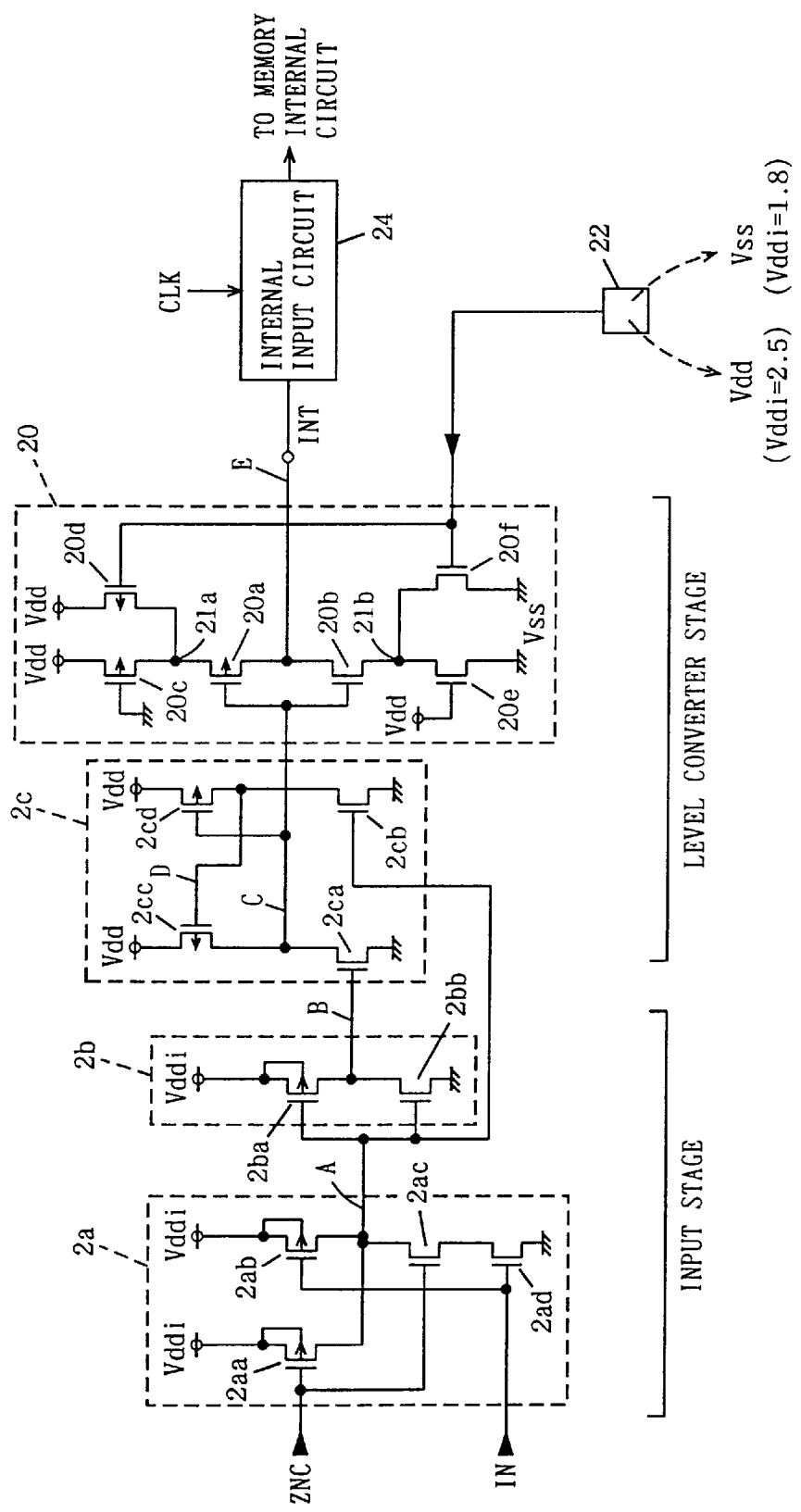
FIG. 1 shows a structure of main components of a semiconductor integrated circuit device according to a first embodiment of the present invention.
Figure 16:
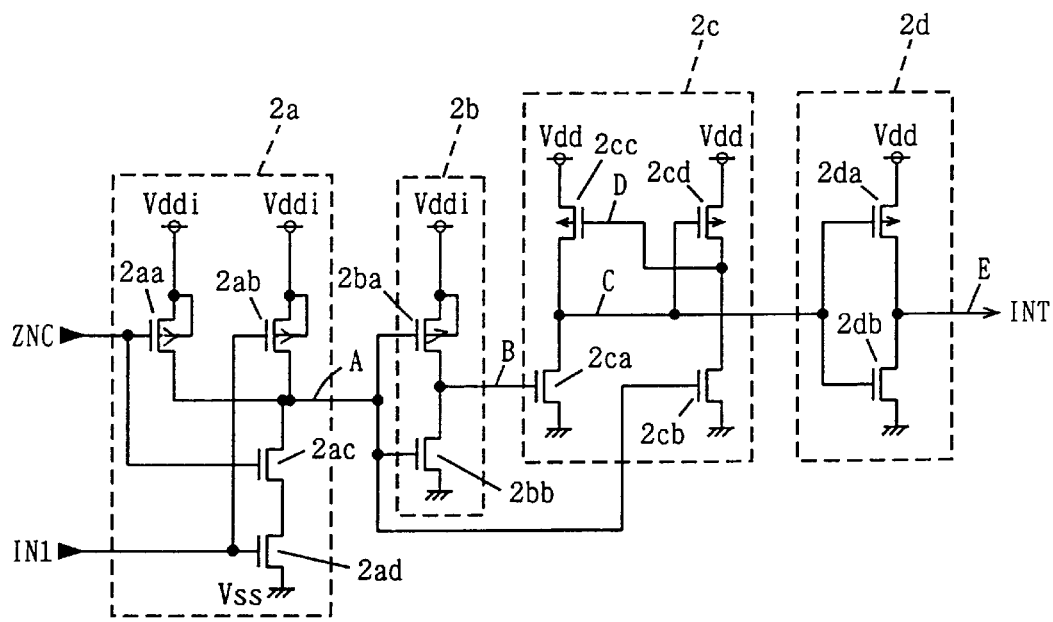
FIG. 16 shows a structure of the first stage of the input circuit shown in FIG. 15.
Figure 17:
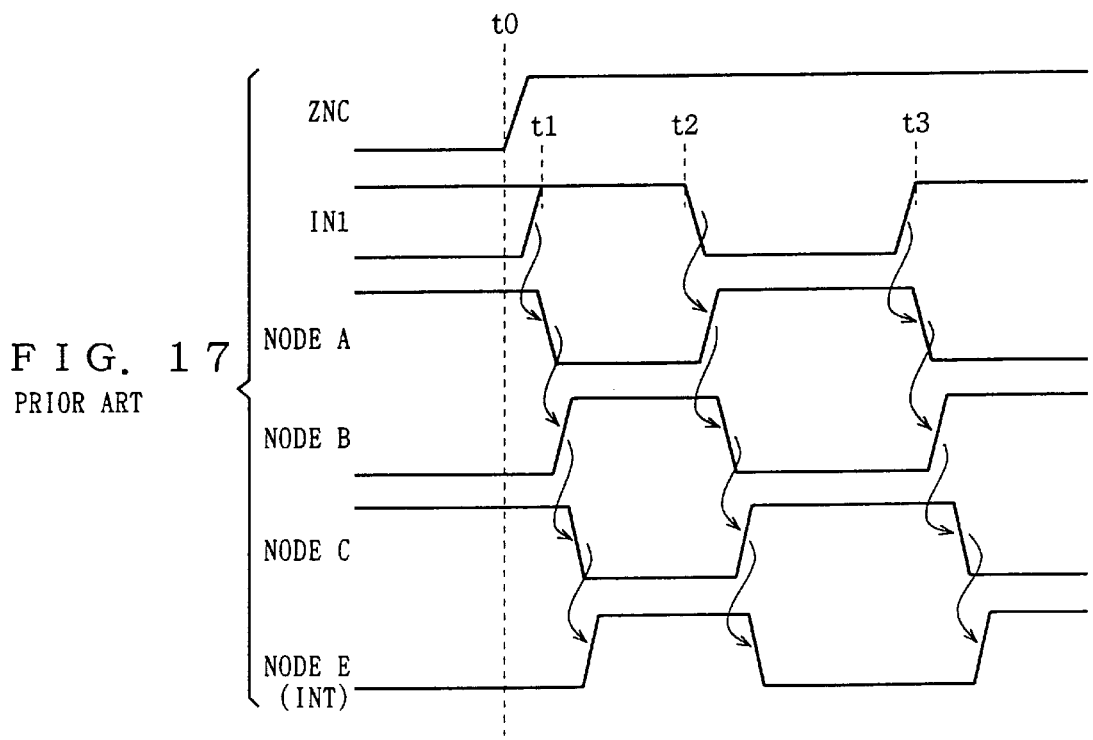
FIG. 17 is a signal waveform diagram representing an operation of the first stage of the input circuit of FIG. 16.
Figure 18:
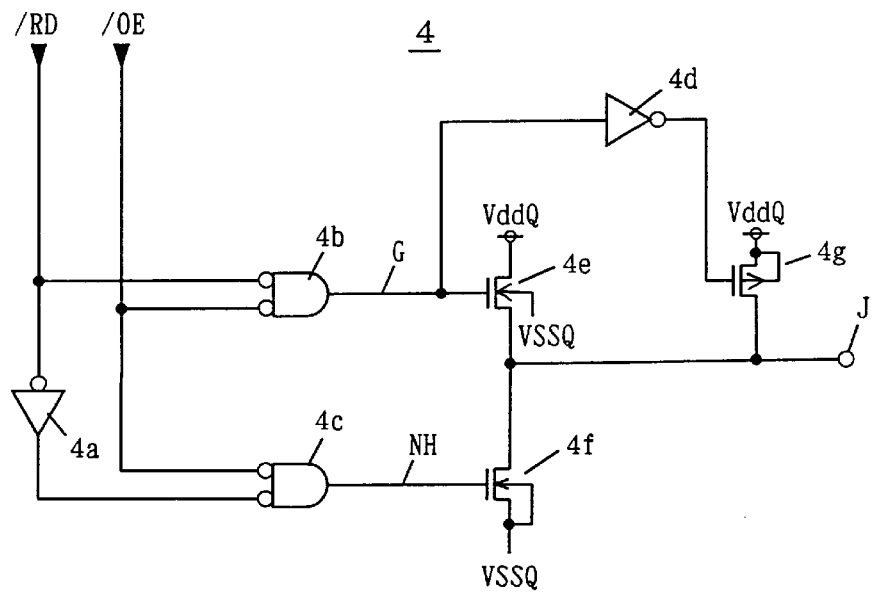
FIG. 18 shows a structure of the last stage of the output circuit of FIG. 15.
Figure 19:
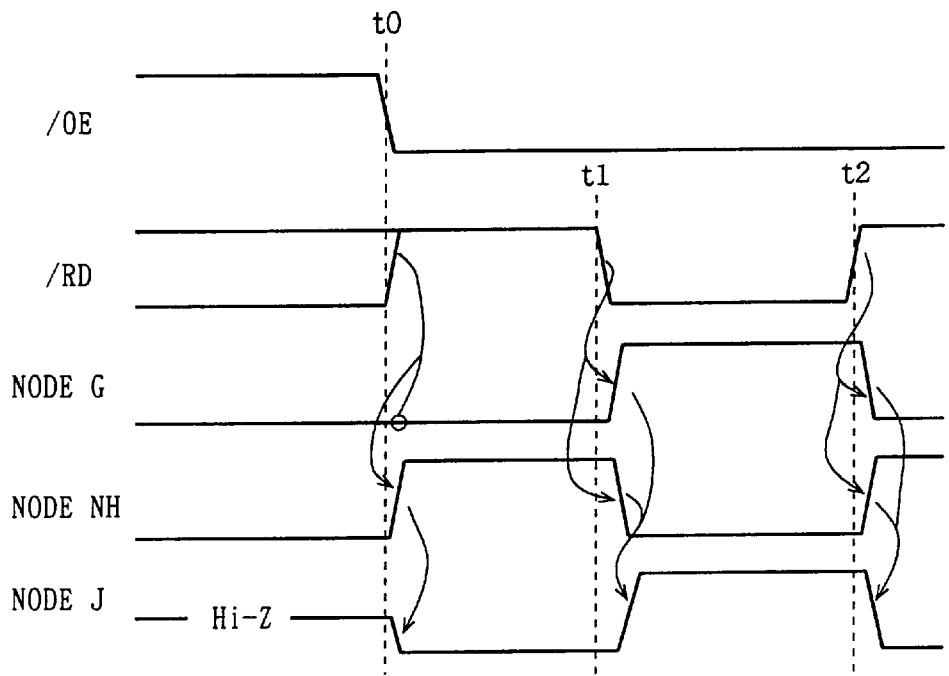
FIG. 19 is a signal waveform diagram representing an operation of the last output stage of FIG. 18.
Figure 20:
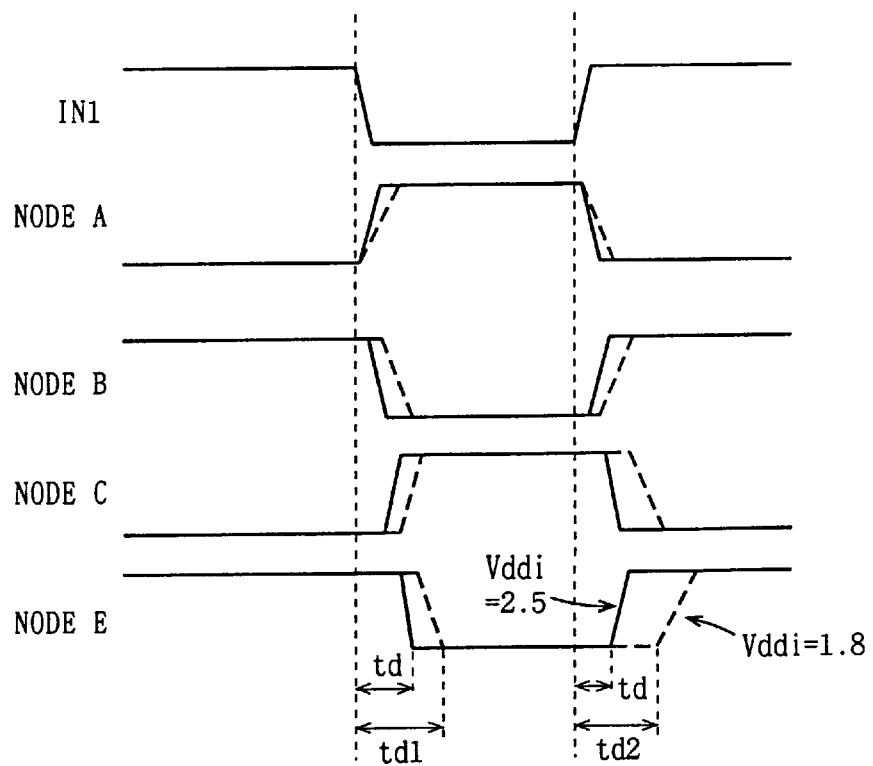
FIG. 20 is a signal waveform diagram used for describing problems in the operation of the input circuit of FIG. 16.
Figure 21:
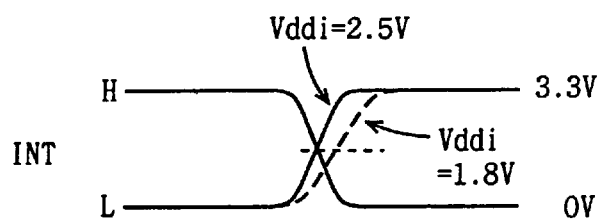
FIG. 21 specifically illustrates the problems of the signal waveform diagram of FIG. 20.
Figures 22A, 22B:
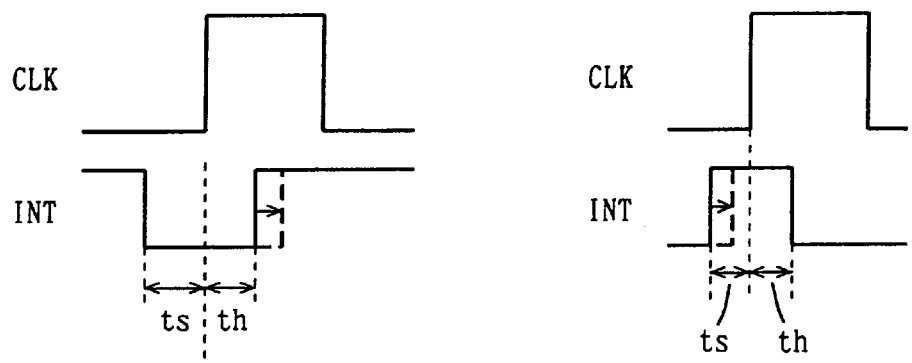
FIGS. 22A and 22B are diagrams for depicting problems when a conventional input circuit is a synchronous type device.
Figure 23A:
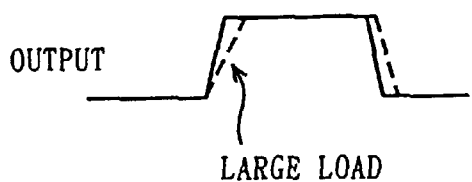
FIGS. 23A, 23B and 23C are diagrams used for describing problems in a conventional output circuit.
Figure 23B:
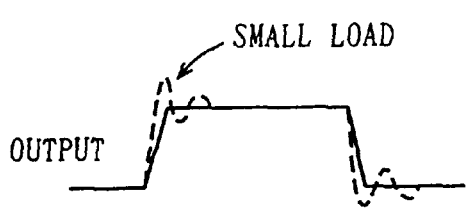
Figure 23C:
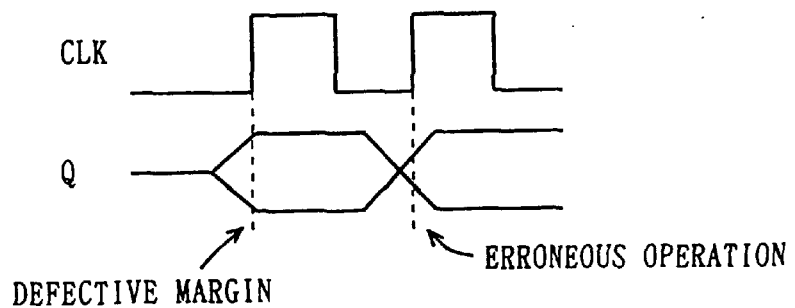

FIG. 1 shows a structure of the main components of a semiconductor integrated circuit device according to a first embodiment. Likewise to FIG. 16, a first stage of an input circuit of a synchronous semiconductor memory device is shown in FIG. 1. Referring to FIG. 1, the input stage of an input circuit includes a buffer circuit 2a rendered operative, when an internally generated first input stage cut signal ZNC is inactive, for buffering an externally applied input signal IN, an inverter buffer circuit 2b for further buffering an output signal of buffer circuit 2a, a level converter 2c for converting the logic amplitude of the output signal of inverter buffer circuit 2b to the level of an internal power supply voltage Vdd, and a buffer circuit 20 with a current adjust function for further buffering the output signal of level converter 2c to generate an internal signal INT at a node E.

Buffer circuit 2a and inverter buffer circuit 2b form the first stage of input, operate with power supply voltage Vddi which is the system power supply voltage as one operating power supply voltage to establish an interface with the outside of the synchronous semiconductor memory device.

Level converter 2c and buffer circuit 20 form a level converter stage to convert the logic amplitude of the signal attaining the level of power supply voltage Vddi to a signal having the level of internal power supply voltage Vdd. Buffer circuit 2a, inverter circuit 2b and level converter 2c have a structure similar to that of the conventional circuit shown in FIG. 16. Corresponding components have the same reference characters allotted, and detailed description will not be repeated.

Buffer circuit 20 with a current adjustment function includes a p channel MOS transistor 20a connected between a first internal node 21a and node E, and having a gate connected to node C, an n channel MOS transistor 20b connected between node E and a second internal node 21b, and having a gate connected to node C, a p channel MOS transistor 20c connected between a power supply node Vdd from which an internal power supply voltage Vdd is supplied and first internal node 21a, and coupled to receive a ground voltage at a gate thereof, a p channel MOS transistor 20d connected between power supply node Vdd and first internal node 21a, and having a gate connected to a bonding pad 22, an n channel MOS transistor 20e connected between second internal node 21b and a ground node Vss, and coupled to receive internal power supply voltage Vdd at a gate thereof, and an n channel MOS transistor 20f connected between second internal node 21b and ground node Vss, and having a gate connected to bonding pad 22.

MOS transistors 20c and 20e are normally kept in a conductive state, and function as current supply elements. MOS transistors 20d and 20f are selectively rendered conductive according to the voltage level of bonding pad 22. When one of MOS transistors 20d and 20f is conductive, the other is non-conductive. Bonding pad 22 is fixed by a bonding wire (not shown) to the level of power supply voltage Vdd or ground voltage Vss in accordance with the level of power supply voltage Vddi. By adjusting the current supply amount by a program of the voltage level of bonding pad 22, the voltage transition speed of node E can be made the same even when the level of power supply voltage Vddi changes.

Figure 15:
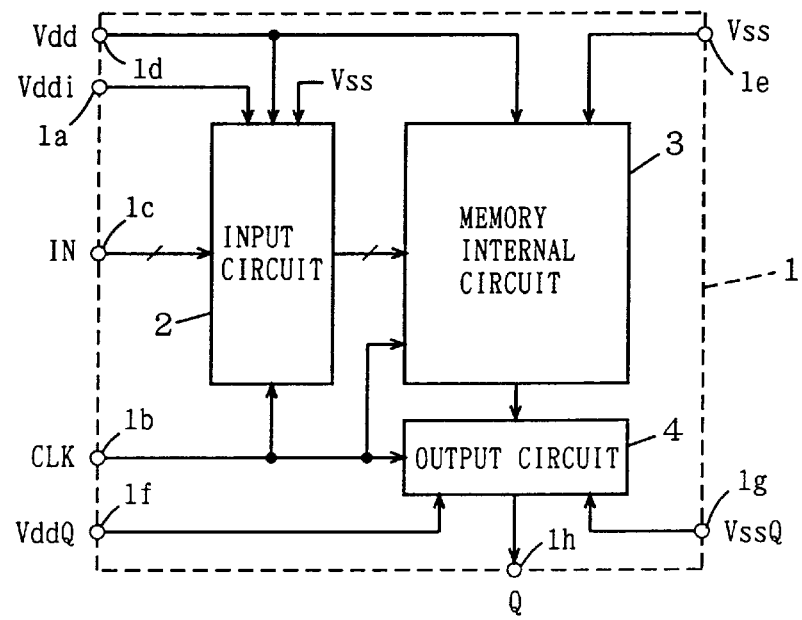
FIG. 15 schematically shows an entire structure of a conventional semiconductor integrated circuit device.

Internal signal INT on node E is applied to an internal input circuit 24 that operates in synchronization with a clock signal CLK. The output signal of internal input circuit 24 is applied to a memory internal circuit 3 shown in FIG. 15. The operation will be described hereinafter.

The operation of buffer circuit 2a, inverter circuit 2b, and level converter 2c are identical to those of the conventional device. When power supply voltage Vddi is set at the level of, for example, 2.5V, bonding pad 22 is connected to a power supply voltage Vdd terminal via a bonding wire to receive power supply voltage Vdd. The term "program" refers to the setting to a fixed state by a fuse element (link element), mask interconnection, bonding wire using a bonding pad, and the like.

When bonding pad 22 is set to receive power supply voltage Vdd, MOS transistors 20f and 20d are rendered conductive and non-conductive, respectively, in buffer circuit 20 with a current adjustment function. Under this state, MOS transistor 20c functions as a current source to charge node E whereas MOS transistors 20e and 20f function as the current source for discharging node E. The parameter (size) of the transistors are set such that the rising time and the falling time of internal signal INT at node E are equal to each other when both MOS transistors 20e and 20f are rendered conductive.

When power supply voltage Vddi is set to, for example, 1.8V, bonding pad 22 is fixed to the level of ground voltage Vss via a bonding wire not shown. In buffer circuit 20 with a current adjustment function, MOS transistors 20f and 20d are rendered non-conductive and conductive, respectively. When power supply voltage Vddi becomes lower, the delay time is increased in buffer circuit 2a, inverter circuit 2b, and level converter 2c. Furthermore, the falling rate at output node C in level converter 2c is decreased. As the current source to charge node E, MOS transistors 20c and 20d are employed in buffer circuit 20 with a current adjustment function at the last stage. Therefore, node E is charged with a greater current drivability in comparison to the case where power supply voltage Vddi is 2.5V. The reduction in the rising rate of internal signal INT at node E is compensated for even when the potential falling rate at node C is reduced.

When the voltage of node C rises, node E is discharged only through MOS transistor 20e. The discharging rate of node E will become slower than the case where power supply voltage Vddi is 2.5V. Therefore, the falling time of internal signal INT is increased. Thus, the rising time and falling time of internal signal INT can be made equal to each other.

Figure 2:
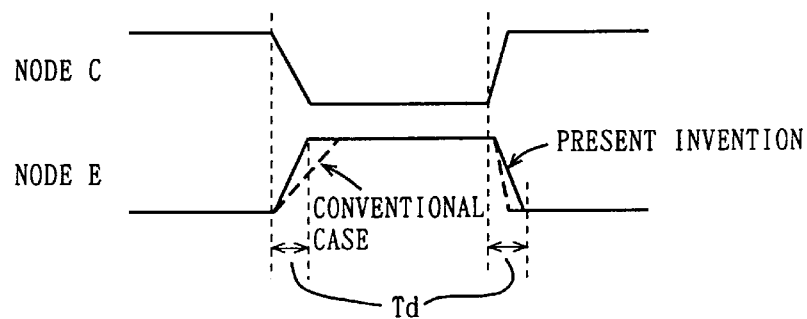
FIG. 2 is a signal waveform diagram representing an operation of the semiconductor integrated circuit device of FIG. 1.

Referring to FIG. 2, when the potential falling rate of node C is slower than the potential rising rate thereof, the charging rate of the output node is increased while the discharging rate is decreased in buffer circuit 20 with a current adjustment function. Therefore, the voltage of node E is raised rapidly by two MOS transistors 20c and 20d even when the voltage of node C falls slowly. When the voltage of node C rises, the discharging rate of node E becomes slower since the discharge is carried out only by one MOS transistor 20e. Thus, the rising time and falling time of internal signal INT at node E can be made equal to Td. By adjusting both the charging rate and discharging rate at internal output node E, a small deviation such as 0.2 ns, for example, can be reliably corrected without increasing the size of the device.

According to the first embodiment of the present invention, the level converter stage generating a signal of the internal power supply voltage level is so implemented that the current drivability of the circuit portion that drives the internal output node is adjusted according to the level of the interface power supply voltage Vddi. Therefore, the rising time and falling time can be made equal even when the power supply voltage Vddi for interface differs in level. There is no timing deviation as to the ascertaining of the internal signal. The timing margin for internal signal INT can be made greater, resulting in a stable operation.

In the case of a synchronous semiconductor memory device, the set up time and hold time of internal signal INT with respect to a clock signal CLK can be made identical for either logic level of the signal independent of the level of power supply voltage Vddi for interface. Thus, an internal operation can be carried out properly.

Second Embodiment

Figure 3:
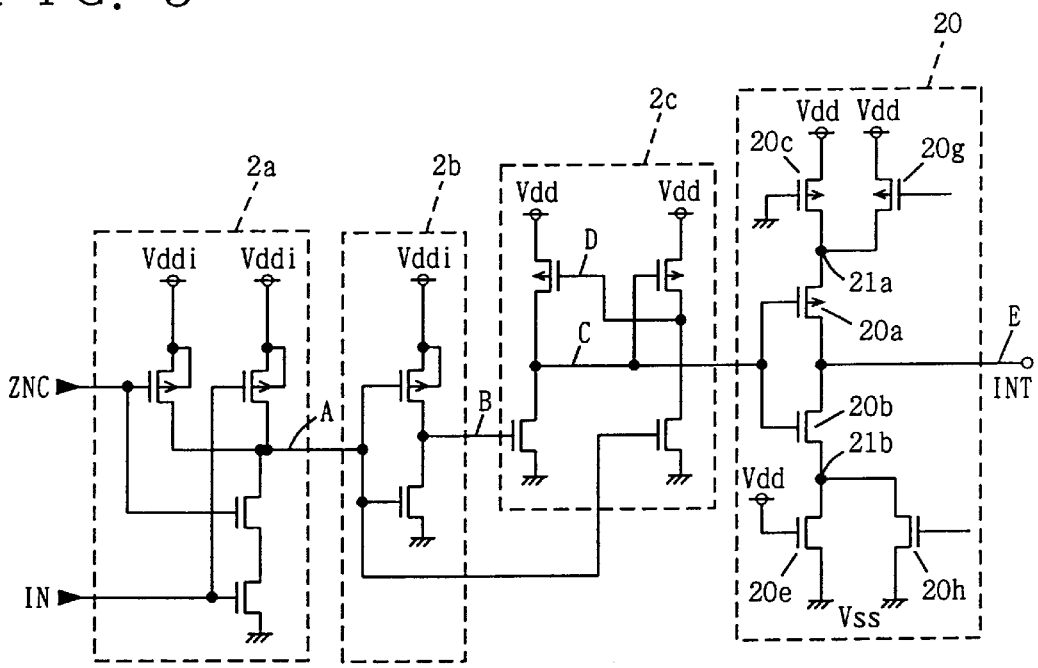
FIG. 3 shows a structure of main components of a semiconductor integrated circuit device according to a second embodiment of the present invention.

FIG. 3 shows a structure of the main components of a semiconductor integrated circuit device according to a second embodiment of the present invention. FIG. 3 shows a structure of the first stage of an input circuit of a synchronous semiconductor memory device formed by the master process. In FIG. 3, the structure of buffer circuit 2a for buffering an externally applied input signal IN, inverter buffer circuit 2b for buffering the output signal of buffer circuit 2a, and level converter 2c for converting the voltage level of output node B of inverter buffer circuit 2b is identical to that of the first embodiment previously described.

In the second embodiment shown in FIG. 3, the structure of buffer circuit 20 with a current adjustment function differs from that of the first embodiment. More specifically, a p channel MOS transistor 20g is provided in parallel to a current supply element 20c, between power supply node Vdd and first internal node 21a, and an n channel MOS transistor 20h is provided in parallel to a current supply element 20e, between second internal node 21b and ground node Vss. The gates of MOS transistors 20g and 20h are kept open in the master process. The gates of MOS transistors 20g and 20h are electrically connected by an aluminum interconnection line at the last slice step.

Figure 4:
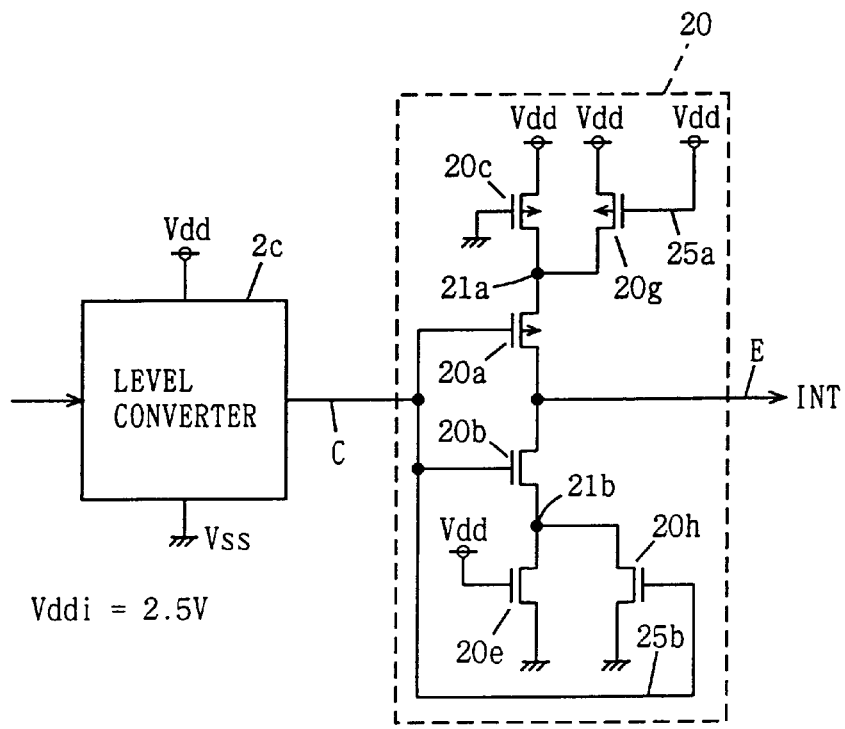
FIGS. 4 and 5 show the line interconnection of the semiconductor integrated circuit device of FIG. 3.

FIG. 4 shows the interconnection of buffer circuit 20 with a current adjustment function when the interface power supply voltage Vddi is 2.5V. Referring to FIG. 4, the gate of MOS transistor 20g is connected to power supply node Vdd by an interconnection 25a. The gate of MOS transistor 20h is connected to node C via an interconnection 25b. Under this state, MOS transistor 20g normally does not conduct, whereby node E is charged only via current supply element 20c. In contrast, MOS transistor 20h is rendered conductive when the voltage of node C attains an H level. Node E is discharged when the voltage of node C attains an H level. This MOS transistor 20h is rendered conductive only when necessary. When the voltage level of node C is pulled down to an L level, MOS transistors 20h and 20b are rendered non-conductive simultaneously to cut off the discharging path of node E.

In the interconnection shown in FIG. 4, the parameter of each transistor is so set that the rising time and falling time of internal signal INT of node E become equal to each other.

Figure 5:
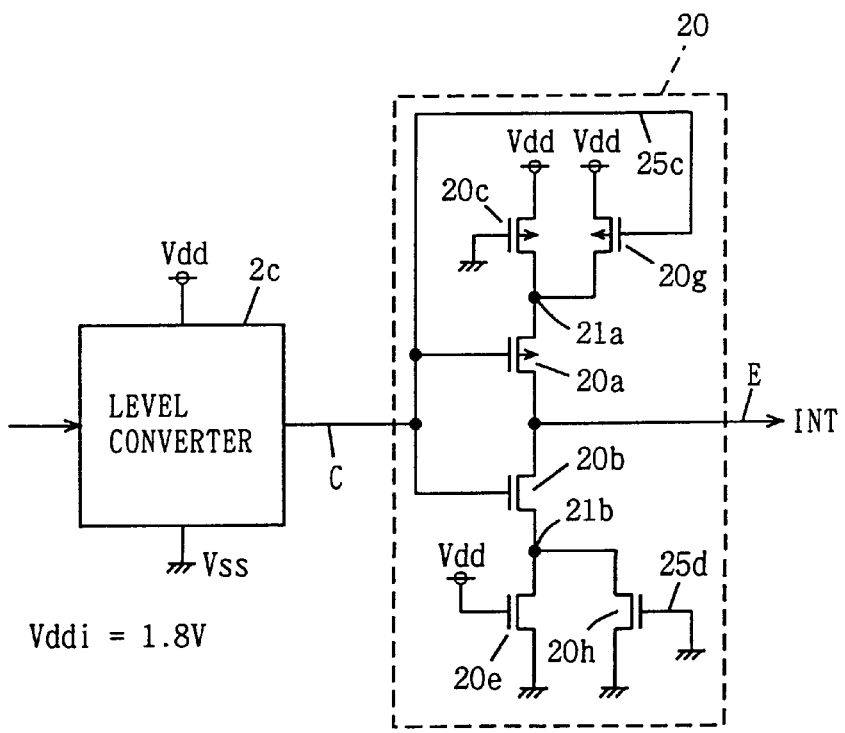

FIG. 5 shows the interconnection of buffer circuit 20 with a current adjustment function when interface power supply voltage Vddi is 1.8V. Referring to FIG. 5, the gate of MOS transistor 20g is connected to node C via an interconnection 25c. The gate of MOS transistor 20h is connected to ground node Vss via an interconnection 25d. Under this state, MOS transistor 20h is constantly in a non-conductive state. MOS transistor 20g is rendered conductive when the potential of node C is pulled down.

According to the interconnection shown in FIG. 5, MOS transistor 20a is supplied with current via MOS transistors 20c and 20g at the fall of the voltage at node C, whereby internal signal INT at node E is quickly pulled up. When the voltage of node C rises, node E is discharged via MOS transistor 20e and the discharging rate thereof becomes slower. Therefore, the delay in the rise of internal signal INT when interface power supply voltage Vddi is 1.8V is compensated for, as in the first embodiment. The falling rate of internal signal INT at node E is slowed down so that the falling time becomes longer than the case where power supply voltage Vddi is 2.5V. Thus, the rising time and falling time of internal signal INT can be made equal when interface power supply voltage Vddi is 1.8V.

Modification 1

Figure 6:
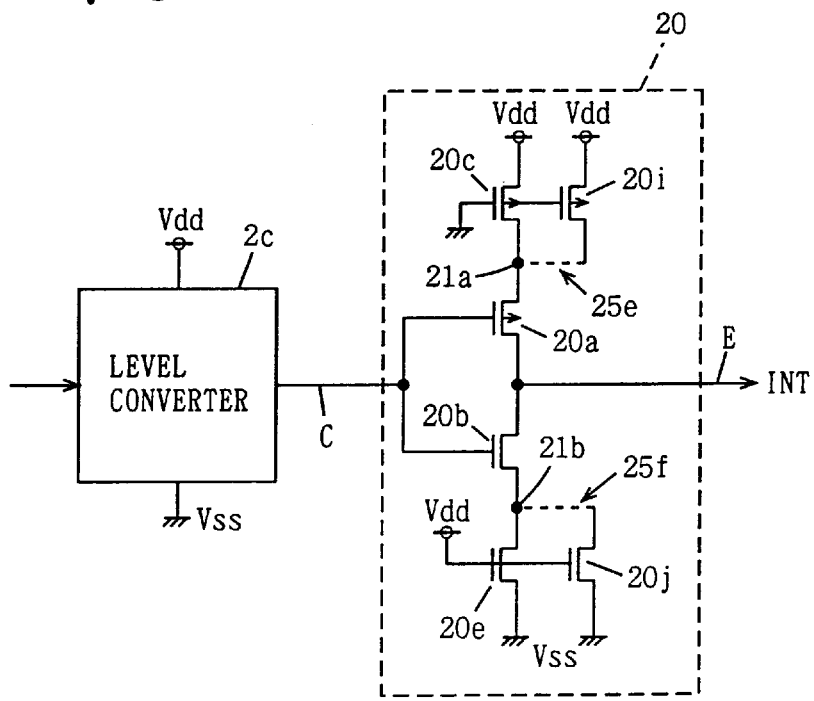
FIG. 6 shows a structure of a modification 1 of the semiconductor integrated circuit device according to the second embodiment of the present invention.

FIG. 6 shows a structure of a modification 1 according to the second embodiment of the present invention. Referring to FIG. 6, buffer circuit 20 with a current adjustment function includes p channel MOS transistors 20c and 20i provided in parallel to each other between first internal node 21a and power supply node Vdd. Also, n channel MOS transistors 20e and 20j are provided in parallel between second internal node 21b and ground node Vss. P channel MOS transistors 20a and 20b are connected in series between nodes 20a and 21b. The gates of MOS transistors 20c and 20i are connected to the ground node. The gates of MOS transistors 20e and 20j are connected to power supply node Vdd. MOS transistor 20i has one conduction terminal (drain) connected to first internal node 21a by a selectively formed interconnection 25e. MOS transistor 20j has a drain selectively connected to second internal node 21b by a selectively formed interconnection 25f.

When interface power supply voltage Vddi is 2.5V, for example, an interconnection 25f is formed. MOS transistor 20j forms a current path between second internal node 21b and ground node Vss. In contrast, an interconnection 25e is not formed. MOS transistor 20i will not implement a current path between power supply node Vdd and first internal node 21a.

When interface power supply voltage Vddi is 1.8V, interconnection 25e is formed. MOS transistor 20i implements a current path between power supply node Vdd and internal node 21a. In contrast, interconnection 25f is not formed. MOS transistor 20j does not implement a current path from second internal node 21b to ground node Vss.

By selectively connecting MOS transistors 20i and 20j for current supply to first and second internal nodes, respectively, according to the level of interface power supply voltage Vddi, the potential transition rate on internal output node E can be adjusted. Accordingly, the rising time and falling time of internal signal INT can be made equal.

Modification 2

Figure 7:
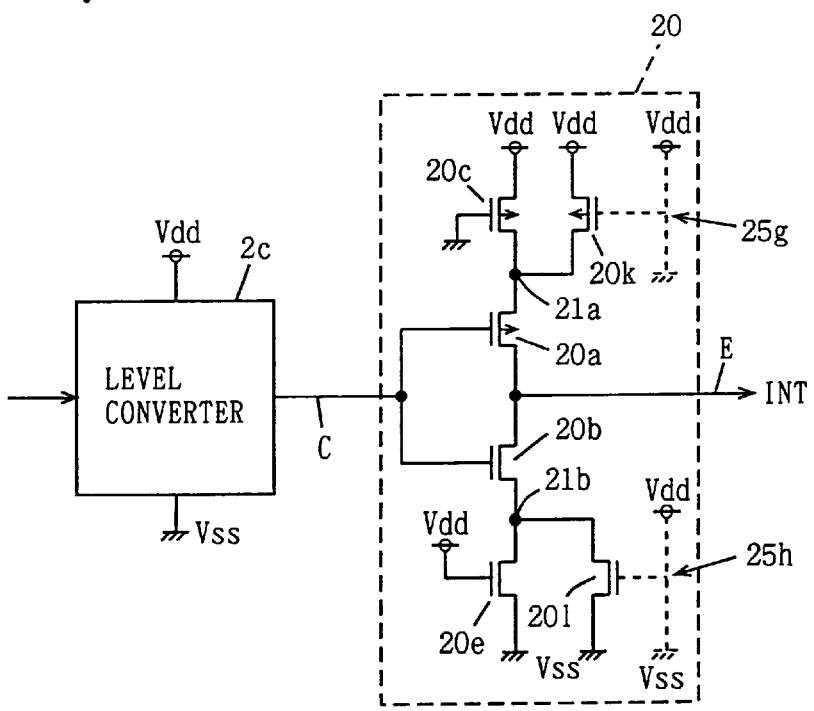
FIG. 7 shows a structure of a modification 2 of the semiconductor integrated circuit device according to the second embodiment of the present invention.

FIG. 7 shows a structure of a modification 2 according to the second embodiment of the present invention. Referring to FIG. 7, a p channel MOS transistor 20k is provided in parallel to p channel MOS transistor 20c for current supply between first internal node 21a and power supply node Vdd. Also, an n channel MOS transistor 20l is provided in parallel to n channel MOS transistor 20e for current supply between second internal node 21b and ground node Vss. MOS transistor 20k has a gate alternatively connected to power supply node Vdd or ground node Vss by interconnection 25g. Also, the gate of n channel MOS transistor 20a is alternatively connected to either power supply node Vdd or ground node Vss by mask interconnection 25h.

When interface power supply voltage Vddi is, for example, 2.5V, mask interconnection 25g connects the gate of MOS transistor 20k to power supply voltage node Vdd. Also, mask interconnection 25h connects the gate of MOS transistor 20l to power supply node Vdd. The size of each transistor is so adjusted that the charging and discharging rates of node E are equal.

When interface power supply voltage Vddi is set to the level of 1.8V, for example, MOS transistor 25k has the gate thereof connected to ground node Vss by mask interconnection 25g. The gate of MOS transistor 20l is connected to ground node Vss by mask interconnection 25h. As a result, MOS transistors 20k and 20l are rendered conductive and non-conductive, respectively, whereby the potential rising rate of node E is slowed down. In contrast, the discharging rate of node E is increased. Thus, the rising time and falling time of internal signal INT are made equal.

According to modification 2, the MOS transistors for adjusting the current supply amount are selectively rendered conductive/non-conductive by mask interconnection. The charging/discharging rate of internal output node E can be made equal regardless of the level of the interface power supply voltage.

Modification 3

Figure 8:
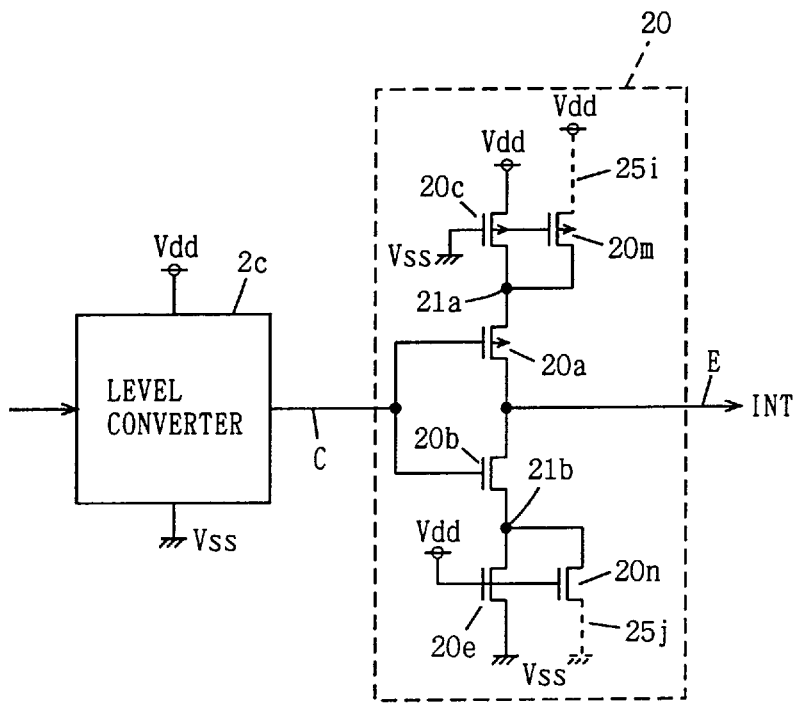
FIG. 8 shows a structure of a modification 3 of the semiconductor integrated circuit device according to the second embodiment of the present invention.

FIG. 8 shows a structure of a modification 3 according to the second embodiment of the present invention.

Referring to FIG. 8, a p channel MOS transistor 20m provided in parallel to current supply element 20c has one conduction terminal (source) selectively connected to power supply node Vdd via interconnection 25i. MOS transistor 20m has a gate thereof connected to ground node Vss. Also, an n channel MOS transistor 20n is provided in parallel to n channel MOS transistor 20e for current supply, between second internal node 21b and ground node Vss. MOS transistor 20n has a gate thereof connected to power supply node Vdd and one conduction terminal (source) selectively connected to ground node Vss by interconnection 25j. When interface power supply voltage Vddi is 2.5V, for example, interconnection 25i is not formed whereas interconnection 25j is formed. MOS transistor 20n functions as a current supply element. Under this state, the rising time and falling time of internal signal INT from internal output node E can be made equal.

When interface power supply voltage Vddi is at a lower voltage level such as 1.8V, interconnection 25i is formed whereas interconnection 25i is not formed. MOS transistor 20m functions as a current supply element. The current supply capability to node E is increased. The rise of internal signal INT becomes faster. MOS transistor 20n will not function as a current supply element. Therefore, the falling rate of internal signal INT at internal output node E is slowed down. Thus, the rising time and falling time of internal signal INT can be set equal.

According to the second embodiment of the present invention, the charging and discharging rates of an internal output node are adjusted according to the level of interface power supply voltage Vddi by mask interconnection. Therefore, a plurality of kinds of interface power supply voltages can be accommodated with one chip. Also, the internal signal generation timing can be adjusted finely. Accordingly, the margin for the timing of ascertaining of an internal signal is increased to ensure a proper operation.

Third Embodiment

Figure 9:
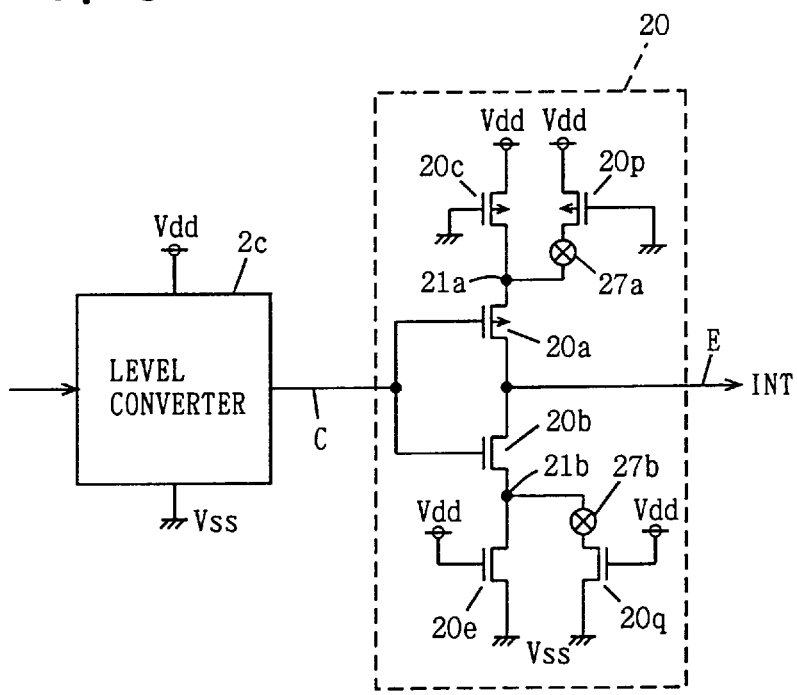
FIG. 9 shows a structure of main components of a semiconductor integrated circuit device according to a third embodiment of the present invention.

FIG. 9 shows a structure of the main components of a semiconductor integrated circuit device according to a third embodiment of the present invention. FIG. 9 shows the structure of the last stage of a level converter stage that converts the internal signal having a logic amplitude of an interface power supply voltage Vddi into the level of internal power supply voltage Vdd.

In FIG. 9, buffer circuit 20 with a current adjustment function differs from buffer circuit 20 in the first and second embodiments in the following points. More specifically, a p channel MOS transistor 20p and a fusible link element (fuse element) 27a are connected in parallel to current supply element 20c, between power supply node Vdd and first internal node 21a. MOS transistor 20p has one conduction node (source) connected to power supply node Vdd, a gate connected to ground node Vss, and another conduction node (drain) connected to first internal node 21a via link element 27a.

Also, an n channel MOS transistor 20q and a fusible link element (fuse element) 27b are connected in parallel to current supply element 20e between second internal node 21b and ground node Vss. MOS transistor 20q has one conduction node (source) connected to ground node Vss, a gate connected to power supply node Vdd, and another conduction node (drain) connected to second internal node 21b via link element 27b.

MOS transistors 20p and 20q are normally in a conductive state. Link elements 27a and 27b are selectively fused. When interface power supply voltage Vddi is, for example, 2.5V, link element 27a is fused by an energy beam such as a laser beam. In the state where MOS transistor 20q functions as a current supply element (discharge element) to increase the discharging rate, the rising time and falling time of internal signal INT from internal output node E are made equal.

When interface power supply voltage Vddi is, for example 1.8V, link element 27b is fused. MOS transistor 20p functions as a current supply element. MOS transistor 20q is disconnected from second internal node 21b. Therefore, the charging rate is increased, and the discharging rate is decreased at internal output node E. Accordingly, the rising time and falling time of internal signal INT are made equal.

Link elements 27a and 27b are programmed at the same program step of replacing a defective cell by a redundant cell in the step of repairing the defective cell among the memory cells in the synchronous semiconductor memory device. More specifically, a link element is fused (programmed) by a laser beam, for example, in programming the address for replacing a defective bit in the repairing step. At the same step of the programming step, link elements 27a and 27b are selectively fused according to the power supply voltage employed by the memory device. Thus, the synchronous semiconductor memory device suited to the employed power supply voltage level can be produced by fusing one link element without increase in the number of the processing steps.

For example, when a reference voltage generation circuit is provided in this synchronous semiconductor memory device, and a trimming step can be carried out to adjust the level of the reference voltage from the reference voltage generation circuit, link elements are selectively fused likewise. Link elements 27a and 27b can be selectively fused during the trimming step.

Modification

Figure 10:
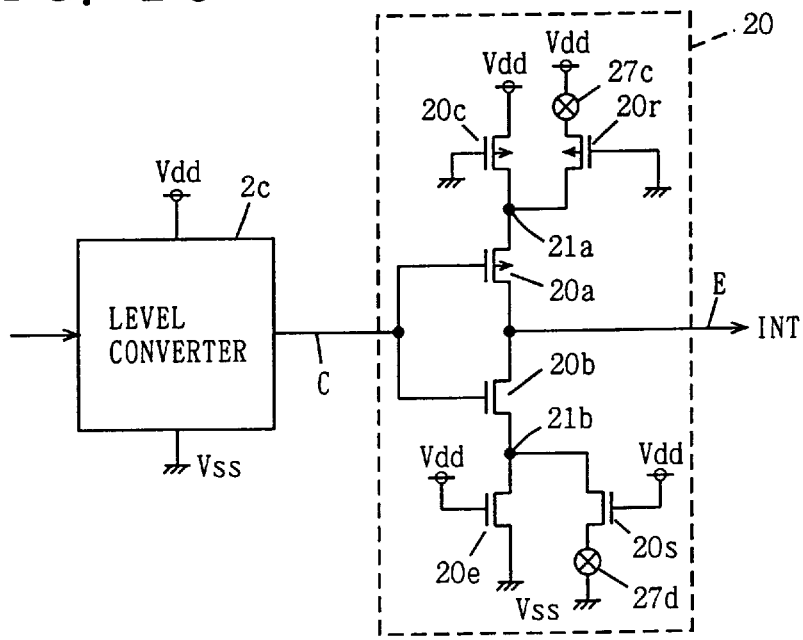
FIG. 10 shows a structure of a modification of the semiconductor integrated circuit device according to the third embodiment of the present invention.

FIG. 10 shows a structure of a modification of the third embodiment of the present invention. The structure shown in FIG. 10 differs from the structure shown in FIG. 9 in the location of the link elements. More specifically, a p channel MOS transistor 20r is provided in parallel to current supply element (MOS transistor) 20c, between power supply node Vdd and first internal node 21a. This p channel MOS transistor 20r has one conduction node (source) connected to power supply node Vdd via link element 27c, a gate connected to ground node Vss, and another conduction node (drain) connected to first internal node 21a. Similarly, an n channel MOS transistor 20f is provided in parallel to current supply element 20d, between second internal node 21b and ground node Vss. This n channel MOS transistor 20f has one conduction node (source) connected to ground node Vss via link element 27d, a gate connected to power supply node Vdd, and another conduction node (drain) connected to second internal node 21b.

According to the arrangement shown in FIG. 10, MOS transistor 20r is disconnected from power supply node Vdd when link element 27c is fused. MOS transistor 20r functions as a parasitic capacitance with respect to first internal node 21a. This contributes to stabilize the voltage level at first internal node 21a. Similarly, n channel MOS transistor 20s is disconnected from the ground node, when link element 27d is fused, to function as a stabilizing capacitance with respect to second internal node 21b. Thus, the voltage level of second internal node 21b is stabilized.

When interface power supply voltage Vdd is, for example, 2.5V in the arrangement shown in FIG. 10, link element 27c is fused, whereby MOS transistor 20r is disconnected from power supply node Vdd. MOS transistor 20s functions as a current supply element. The circuit is so designed that the rising time and falling time of internal signal INT at internal output node E are equal under this state. When interface power supply voltage Vddi is, for example, 1.8V, link element 27d is fused. MOS transistor 20s is disconnected from the ground node. MOS transistor 20r functions as a current supply element. Thus, the deviation in the rise/fall of internal output node E upon the reduction of interface power supply voltage Vddi is adjusted so that the rising time and the falling time are made equal.

According to the third embodiment of the present invention, the potential of the internal output node is adjusted by fusing/non-fusing (programming) the link element depending on the level of the interface power supply voltage. Therefore, the rising/falling time of internal signal INT can be adjusted according to the interface power supply voltage level. Deviation in the rising and falling timing is not encountered even when the interface power supply voltage becomes lower. A device that operates properly can be realized. Since there is no offset in the timing, the timing margin for ascertaining of an internal signal can be increased. Thus, a synchronous semiconductor memory device that operates stably can be realized.

Fourth Embodiment

Figure 11:
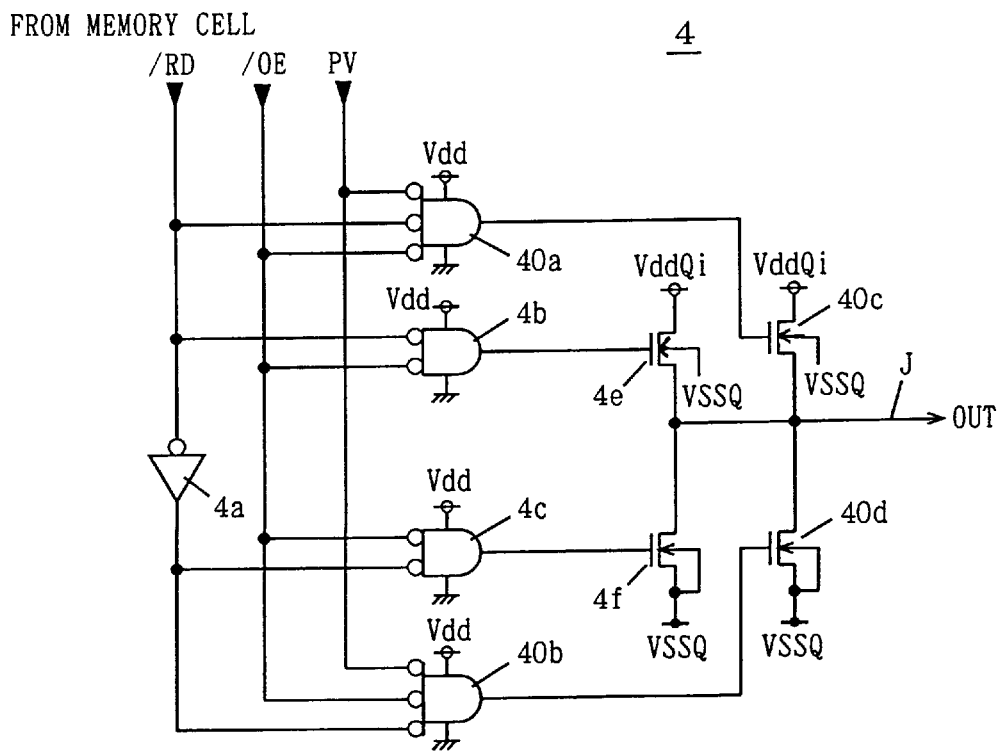
FIG. 11 shows a structure of main components of a semiconductor integrated circuit device according to a fourth embodiment of the present invention.

FIG. 11 shows a structure of an output circuit of a synchronous semiconductor memory device according to a fourth embodiment of the present invention. Referring to FIG. 11, an output circuit 4 includes an inverter 4a receiving data /RD read out from a memory cell, a 2-input NOR circuit 4b receiving internal read out data /RD and an output enable signal /OE, a 2-input NOR circuit 4c receiving an output signal of inverter 4a and output enable signal /OE, a 3-input NOR circuit 40a receiving internal read out data /RD, output enable signal /OE, and a program voltage PV, and a 3-input NOR circuit 40b receiving an output signal of inverter 4a, output enable signal /OE, and program voltage PV. These NOR circuits 4b, 4c, 40a and 40b operate with internal power supply voltage Vdd as one operating power supply voltage.

Output circuit 4 further includes an n channel MOS transistor 4e connected between power supply node VddQi and an output node J and receiving an output signal of NOR circuit 4b at a gate thereof, an n channel MOS transistor 40c connected between power supply node VddQi and output node J and receiving an output signal NOR circuit 40a at a gate thereof, an n channel MOS transistor 4f connected between output node J and ground node VSSQ and receiving an output signal of NOR circuit 4c at a gate thereof, and an n channel MOS transistor 40d connected between output node J and ground node VSSQ and receiving an output signal of NOR circuit 40b at a gate thereof. Voltage VddQi assumes a level identical to an external interface power supply voltage Vddi. Power supply nodes VddQi and VSSQ are provided exclusively for the last stage of the output circuit to prevent variation in power supply voltages VddQi and VSSQ at the time of data output. Ground voltage VSSQ is applied to the substrate region of MOS transistors 4e, 4f, 40c and 40d.

Power supply voltage VddQi assumes the level of 1.8V or 2.5V, as in the first to third embodiments. Different levels of the interface power supply voltage implies that a different system employing the memory device accompanies a different output load of output node J. In this case, internal power supply voltage vdd attains a level higher than interface power supply voltage VddQi. MOS transistors 4e, 4f, 40c and 40d operate in a nonsaturated region. Therefore, when interface power supply voltage VddQi is 2.5V, a large charge/discharge current flows to output node J. In contrast, when interface power supply voltage VddQi is, for example, 1.8V, the charge/discharge current for node J becomes smaller.

Refer to the equation of $$Ids=\beta((VGS-VTH)\ VDS+VDS^2/2)$$

if VDS<VGS−VTH.

Here, VDS indicates the drain-source voltage, VTH the threshold voltage of the MOS transistor, IDS the drain current, and VGS the gate-source voltage.

When the employing system differs and the interface power supply voltage is different, the load of output node J is changed. Also, the amount of the discharge current of output node J differs. In such a case, a problem may be encountered that ringing occurs at an output node of a system although such ringing does not occur in a different system. There is also a problem that, while no ringing occurs, the transition rate of a signal is slowed down.

To cope with such problems, an arrangement as shown in FIG. 11 is provided. An n channel MOS transistor 40c is provided in parallel to the charging MOS transistor 4e. Also, a MOS transistor 4d is provided in parallel to the discharging n channel MOS transistor 4f. MOS transistors 40c and 40d are selectively rendered operative. More specifically, when program voltage PV is now set to an H level, for example, NOR circuits 40a and 40b provide output signals of an L level, whereby MOS transistors 40c and 40d are fixed at a non-conductive state. In this case, output node J is charged/discharged by MOS transistors 4e and 4f according to internal read data /RD and output enable signal /OE. In this case, the current drivability of output circuit 4 is reduced (the charging/discharging rate of node J is identical).

When program voltage PV is set to an L level, NOR circuits 40a and 40b are rendered operative. MOS transistor 40c is rendered conductive/non-conductive in phase with MOS transistor 4e. Also, MOS transistor is rendered conductive/non-conductive in phase with MOS transistor 4f. In this case, output node J is charged or discharged by two MOS transistors. Therefore, the current drivability of output circuit 4 is increased. Program voltage PV is fixed to an H level or an L level according to the applied system. More specifically, in the case where the level of interface power supply voltage VddQi is low to cause a small drain current, and where no ringing occurs even when the current drivability of output circuit 4 is increased, program voltage PV is set to an L level.

In the case where the output load is small and charging/discharging using two MOS transistors will cause a ringing at the node J even though the level of interface power supply voltage VddQi is low, program voltage PV is fixed to an H level. A device having a reduced current drivability of the output circuit is implemented.

For a system power supply voltage VddQi of, for example 2.5V causing a relatively large drain current flow, program voltage PV is set to an H level in case that ringing occurs if two MOS transistors are rendered conductive simultaneously. When the load of output node J is large and ringing does not occur even if charging or discharging is carried out using two MOS transistors under an interface power supply voltage of 2.5V, a device having the program voltage PV set to an L level is used.

Thus, a product having a program voltage PV set to an H level or an L level is employed according to the applied system. An output circuit can be realized that is adapted to the operating environment to operate stably without an output noise and that provides a signal that attains an ascertained state at the correct timing.

Figure 12A:
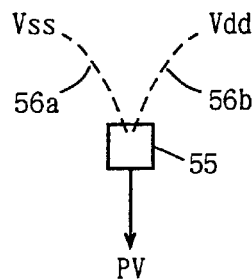
FIGS. 12A, 12B and 12C illustrate a method of generating a program voltage of FIG. 11.
Figure 12B:
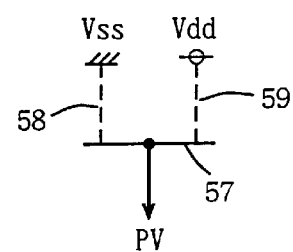

FIGS. 12A and 12B schematically show a structure of the component generating program voltage PV. Referring to FIG. 12A, program voltage PV according to the voltage level of a bonding pad 55 is generated. Bonding pad 55 is fixed alternatively to a ground voltage Vss by a bonding wire 56a or power supply voltage Vdd by a bonding wire 56b. At the bonding step in packaging a semiconductor integrated circuit device, the level of the drivability of the output circuit can be set.

Referring to FIG. 12B, program voltage PV is generated from a signal line 57. Signal line 57 is connected to ground node Vss by a mask interconnection 58 or to power supply node Vdd by a mask interconnection 59. In this case, program voltage PV is set to determine the level of the drivability of the output circuit at the final step of the fabrication process of the device.

Figure 12C:
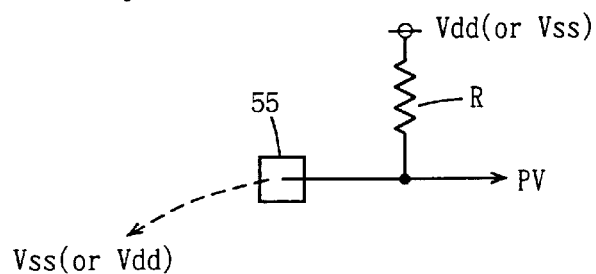

In FIG. 12A, ground voltage Vss or power supply voltage Vdd is transmitted to bonding pad 55 via bonding wire 56a or 56b. Alternatively, as shown in FIG. 12C a structure can be used in which a program voltage PV of one logic level is generated when bonding pad 55 is connected to power supply voltage Vdd or ground voltage Vss via a bonding wire shown by a dotted arrow, and the program voltage PV is set to the other logic level when bonding pad 55 is kept open (not connected to a bonding wire). For example, a resistor element R of a high resistance is connected to bonding pad 55, and the voltage level of the other end of resistor element is set according to whether there is a bonding wire or not.

Modification

Figure 13:
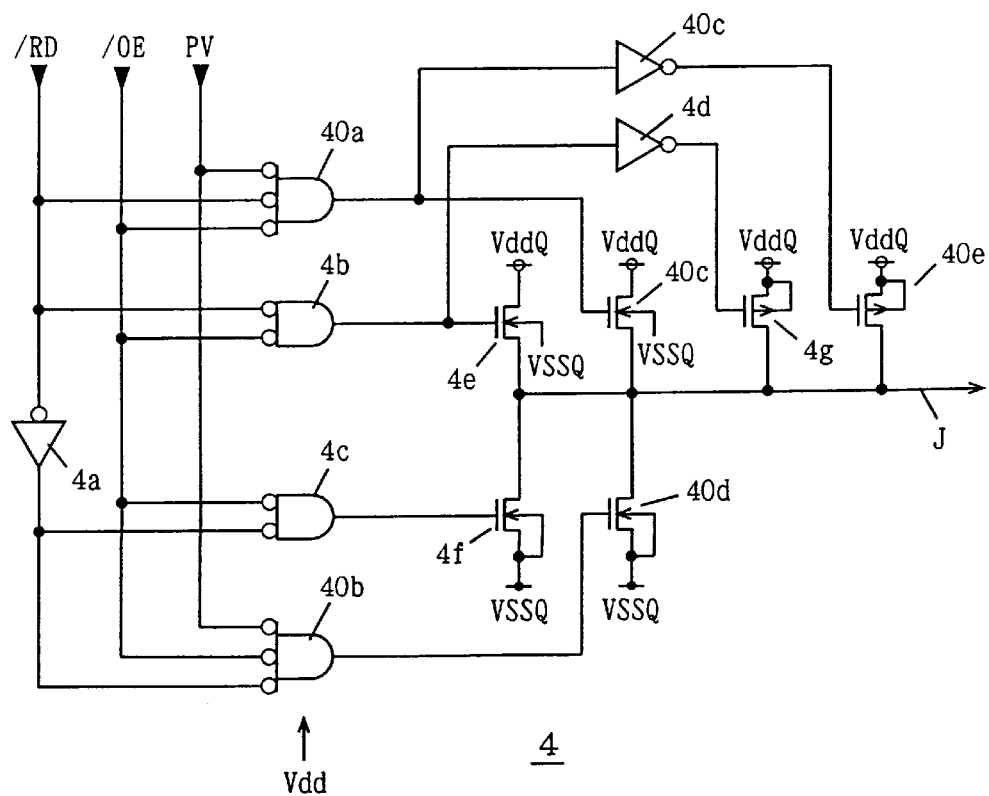
FIG. 13 shows a structure of a modification of the fourth embodiment of the present invention.

FIG. 13 shows a structure of a modification according to the fourth embodiment of the present invention. In output circuit 4 shown in FIG. 13, the level of power supply voltage Vdd applied exclusively for the last stage of the output circuit and the level internal power supply voltage Vdd are identical with each other. Also, for the purpose of compensating for the threshold voltage loss at n channel MOS transistors 4e and 40e, p channel MOS transistors 4g and 40e are provided in parallel to n channel MOS transistors 4e and 40c to charge output node J. An output signal of inverter 4d receiving the output signal of NOR circuit 4b is applied to the gate of MOS transistor 4g. The output signal of inverter 40c receiving an output signal of NOR circuit 40a is applied to the gate of MOS transistor 4e. The remaining structure is similar to that shown in FIG. 11.

According to the structure shown in FIG. 13, MOS transistors 4e and 4g are rendered conductive/non-conductive in phase with each other. Also, MOS transistors 40c and 40e are rendered conductive/non-conductive in phase with each other. By setting program voltage PV to an H level or an L level, the current drivability of output circuit 4 can be adjusted. By appropriately using a device having a great current drivability or a small current drivability according to the load of output node J, data can be output stably and speedily with no ringing.

In the structure shown in FIG. 13, n channel MOS transistor 40c and p channel MOS transistor 40e are used. In general, a p channel MOS transistor has a current drivability smaller than that of an n channel MOS transistor. In the case where a current drivability identical to that of an n channel MOS transistor is to be realized in a p channel MOS transistor, the size (the ratio of the gate width to the gate length) of the p channel MOS transistor is set greater than the n channel MOS transistor. By using both an n channel MOS transistor 40c and a p channel MOS transistor 40e, the area occupied by p channel MOS transistor 40e can be reduced. This contributes to suppressing increase in the area for output circuit 4. It is to be noted that p channel MOS transistors 4g and 40e are provided only for the purpose of compensating for the threshold voltage loss across n channel MOS transistors 4e and 40c. This means that a great current drivability is not particularly required. Therefore, the area can be reduced.

By providing n channel MOS transistors 4e and 40c corresponding to two n channel MOS transistors 4f and 40d for discharge in parallel, the charging rate of node J when both n channel MOS transistors 4f and 40d are rendered conductive can easily be set equal to the discharging rate. In other words, the discharging rate of two n channel MOS transistors for discharge should be set equal to the charging rate of one pair of an n channel MOS transistor and a p channel MOS transistor. The size of the additional pair of the N/P MOS transistors can be determined according to the size of the transistors for adjusting the current drivability.

According to the fourth embodiment of the present invention, the current drivability of the output node can be adjusted by means of a bonding pad or a mask interconnection. Therefore, a synchronous semiconductor memory device that has optimum output characteristics adapted to the applied operating environment can be used. This contributes to the implementation of an optimum memory system. A stable synchronous semiconductor memory device can be realized that has generation of ringing at an output node and erroneous operation due to the output noise suppressed.

Other Applications

In the previous description, a synchronous semiconductor memory device is taken as an example. The present invention is applicable to any device that has an interface circuit (input/output circuit) to establish an interface, and that has an interface power supply voltage differing from the level of the internal power supply voltage.

Any synchronous semiconductor memory device that takes in an external signal and inputs/outputs data in synchronization with the clock signal can be used. The present invention is applicable to any synchronous static random access memory and synchronous dynamic random access memory.

The above description is provided in which internal power supply voltage Vdd is higher in level than interface power supply voltage Vddi. However, the present invention is applicable to a device in which the level of the external interface voltage is higher than the internal power supply voltage, and in which the interface voltage is down-converted within the memory device, namely a device in which internal power supply voltage Vdd is lower than interface power supply voltage Vddi such as a dynamic random access memory. In the case where an internal voltage-down circuit is used, a structure is employed in which NOR circuits 40a and 4b in the output circuit, for example, shown in FIG. 11 has level conversion function to convert the level of the internal power supply voltage to that of the external power supply voltage.

Figure 14:
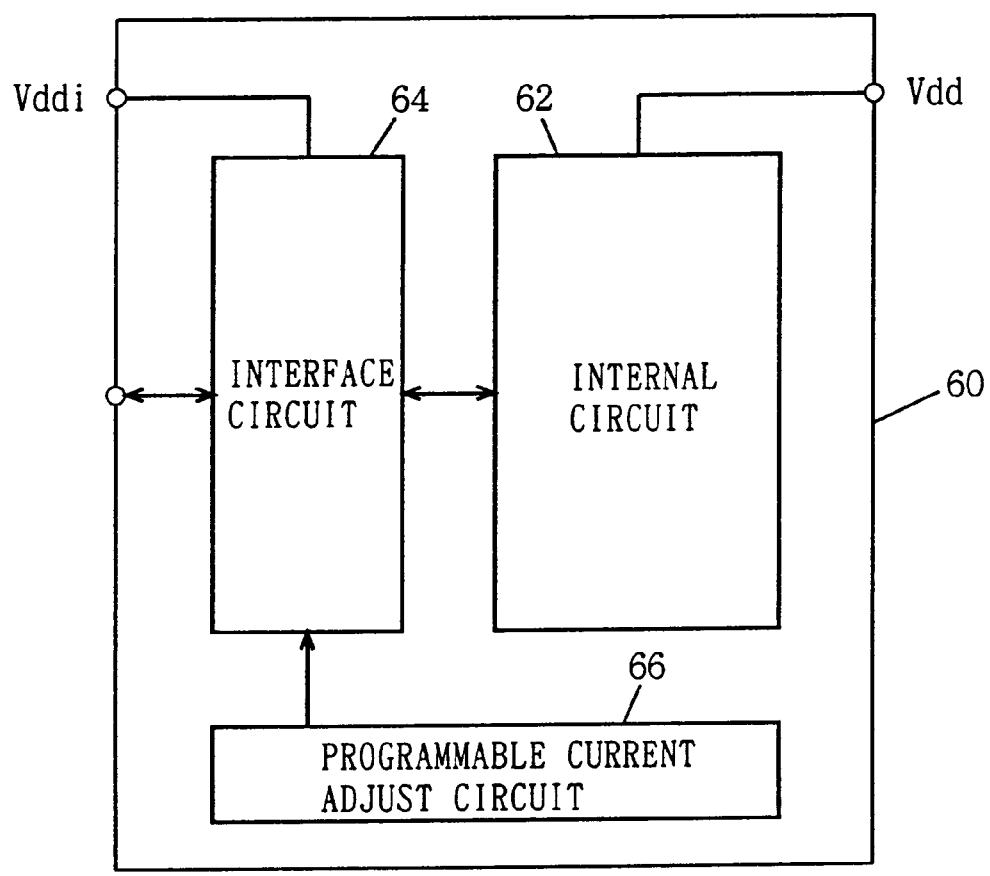
FIG. 14 schematically shows another structure of a semiconductor integrated circuit device according to the present invention.

Furthermore, the semiconductor integrated circuit device is not limited to a synchronous semiconductor memory device, and the present invention can be applied to a device that carries out the general logic operation as shown in FIG. 14. Referring to FIG. 14, a semiconductor integrated circuit device 60 includes an internal circuit 62 operating with power supply voltage Vdd as one operating power supply voltage to carry out a predetermined operation, an interface circuit 64 operating with interface power supply voltage Vddi as one operating power supply voltage and establishing an interface with an outside of the device, and a programmable current adjust circuit 66 for adjusting the current drivability for the internal node or output node of interface circuit 64 in a programmable manner.

A structure shown in the first to fourth embodiments can be appropriately applied according to the operating environment for the input and output stages in interface circuit 64. A large timing margin with respect to the internal signal is not required in the operational processing. A logic operation can be carried out at high speed. Also, the output result can be provided stably and speedily. The level of the interface power supply voltage can be arbitrary. The present invention is applicable even if there are three or more levels of the interface power supply voltage. The current amount is to be adjusted according to each voltage level.

According to a structure of the present invention, the potential transition speed of a signal on an output node of a signal processing circuit that carries out a predetermined process on an applied signal to output the processed signal can be adjusted in a programmable manner. Thus, a signal can be output at a stable and correct timing suited to the operating environment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a signal processing circuit for carrying out a predetermined process on an applied signal to output a signal corresponding to said applied signal on an output node, said signal processing circuit including an interface stage establishing an interface with an outside of said semiconductor integrated circuit device; and
   an adjust circuit coupled to said signal process circuit for adjusting a potential transition rate of the signal on said output node by setting a current driving level on said output node selectively to one of a plurality of current driving levels according to a level of an operation power supply voltage of said interface stage.

2. The semiconductor integrated circuit device according to claim 1, wherein said signal processing circuit comprises
   an input stage operating with a first power supply voltage as one operating power supply voltage, for receiving and buffering said applied signal, and a level converter stage operating with a second power supply voltage as one operating power supply voltage, for converting a voltage level of a signal received from said input stage for application to said node, wherein said adjust circuit comprises a component for adjusting current drivability for said node of said level converter stage in a programmable manner.

3. The semiconductor integrated circuit device according to claim 2, wherein said level converter stage comprises a first insulated gate type field effect transistor of a first conductivity type coupled between a first internal node and said node, and a second insulated gate type field effect transistor of a second conductivity type coupled between a second internal node and said node, wherein said component sets respective current amounts of said first and second internal nodes in a programmable manner according to a level of said first power supply voltage.

4. The semiconductor integrated circuit device according to claim 3, wherein said component comprises a first current supply element coupled between a first power supply node supplying said second power voltage and said first internal node, a second current supply element coupled between said second internal node and a second internal node and a second power supply node supplying a third power supply voltage, a first programmable element arranged between said first power supply node and said first internal node in a connectable manner for forming a path causing a current flow between said first power supply node and said first internal node when connected and made conductive; and a second programmable element arranged between said second power supply node and said second internal node in a connectable manner for forming a path causing a current flow between said second power supply node and said second internal node when connected and made conductive, wherein said first and second programmable elements are selectively programmed to be fixed to either a conductive or non-conductive state.

5. The semiconductor integrated circuit device according to claim 4, wherein said first programmable element comprises a third insulated gate type field effect transistor coupled between said first power supply node and said first internal node, and receiving a predetermined voltage at a gate thereof, and said second programmable element comprises a fourth insulated gate type field effect transistor coupled between said second power supply node and said second internal node, and receiving said predetermined voltage at a gate thereof.

6. The semiconductor integrated circuit device according to claim 5, wherein each of the third and fourth insulated gate type field effect transistors has the gate coupled to a bonding pad receiving said predetermined voltage.

7. The semiconductor integrated circuit device according to claim 5, wherein each of the third and fourth insulated gate type field effect transistors has the gate coupled to one of the first and second power supply nodes through an interconnection line and receiving said predetermined voltage through said interconnection line.

8. The semiconductor integrated circuit device according to claim 1, wherein said interface stage includes said output node.

9. The semiconductor integrated circuit device according to claim 1, wherein said signal processing circuit comprises an input circuit for buffering an externally applied signal to generate an internal signal.

10. The semiconductor integrated circuit device according to claim 2, wherein said first power supply voltage is lower than said second power supply voltage.

11. A semiconductor integrated circuit device comprising:

a signal processing circuit for carrying out a predetermined process on an applied signal to output a signal corresponding to said applied signal on an output node, said signal processing circuit including an interface stage establishing an interface with an outside of said semiconductor integrated circuit device; and an adjust circuit coupled to said signal processing circuit for adjusting a potential transition rate of the signal on said output node, said adjust circuit including means for setting said transition rate of the signal on said output node to a fixed rate according to a level of an operating power supply voltage of said interface stage by selectively setting a current driving level on said output node of said interface stage to one of a plurality of current driving levels.

* * * * *